US006936537B2

(12) United States Patent
Hogle et al.

(10) Patent No.: US 6,936,537 B2
(45) Date of Patent: Aug. 30, 2005

(54) METHODS FOR FORMING LOW-K DIELECTRIC FILMS

(75) Inventors: Richard A. Hogle, Oceanside, CA (US); Patrick Joseph Helly, Valley Center, CA (US); Ce Ma, Apex, NC (US); Laura Joy Miller, San Diego, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 200 days.

(21) Appl. No.: 10/121,270

(22) Filed: Apr. 12, 2002

(65) Prior Publication Data

US 2002/0192980 A1 Dec. 19, 2002

Related U.S. Application Data

(60) Provisional application No. 60/299,409, filed on Jun. 19, 2001.

(51) Int. Cl.[7] .................................... H01L 21/44

(52) U.S. Cl. .................................... 438/680; 438/778

(58) Field of Search .................................... 438/240, 602, 438/603, 604, 680, 681, 679, 779, 780, 781, 789, 790, 778

(56) References Cited

U.S. PATENT DOCUMENTS 5,310,583 A 5/1994 Eckstein et al.
5,376,409 A 12/1994 Kaloyeros et al. .......... 427/248
5,429,995 A * 7/1995 Nishiyama et al. ......... 438/788
6,440,876 B1 * 8/2002 Wang et al. ................ 438/778
6,472,076 B1 10/2002 Hacker

FOREIGN PATENT DOCUMENTS

EP 0 516 308 B1 6/1996
WO WO 01/29052 A1 4/2001

OTHER PUBLICATIONS

Thermolysis of POSS, Mar. 1996, USA, Mantz.*

R. A. Mantz, P. F. Jones, K. P. Chaffee, J. D. Lichtenhan, and J. W. Gilman, "Thermolysis of Polyhedral Oligomeric Silsesquioxane (POSS) Macromers and POSS–Siloxane Copolymers," Chem. Mater., vol. 8, No. 6, 1996, pp. 1250–1259.

Australian Patent Office Written Opinion and Search Report for Application No. SG 200203106–0, mailed Jan. 20, 2004.

* cited by examiner

*Primary Examiner*—David Nhu
(74) *Attorney, Agent, or Firm*—David A. Hey

(57) ABSTRACT

The use of a polyhedral oligomeric silsesquioxane compound and linking agent to form an ultra low-k dielectric film on semiconductor or integrated circuit surfaces is disclosed. The reaction between the polyhedral oligomeric silsesquioxane compound and linking agent is done in a chemical vapor deposition chamber.

30 Claims, No Drawings

METHODS FOR FORMING LOW-K DIELECTRIC FILMS

This application claims priority from U.S. Provisional Patent Application Ser. No. 60/299,409 filed Jun. 19, 2001.

FIELD OF THE INVENTION

The present invention provides for methods for forming a low-k dielectric film on semiconductor or integrated circuits employing a polyhedral oligomeric silsesquioxane. More particularly, the present invention provides for using the polyhedral oligomeric silsesquioxane and a polymer linking agent to form a structure that when applied as a film will have an ultra low-k dielectric constant less than or equal to 2.6.

BACKGROUND OF THE INVENTION

The increase in semiconductor design integration by feature size reduction has resulted in increased levels of interconnect and increased utilization of dielectric low-k thin films. The dielectric film is used as insulation around metal lines of a device and contributes to the RC time constant that controls the device speed. As the semiconductor industry has strived to reduce resistance (R) by the use of copper metallization, the push to the use of low-k dielectrics is to reduce capacitance (C). Reducing capacitance by lowering the dielectric constant k to the inter and intra level dielectric (ILD) film can improve device performance by reducing the RC time delay, decreasing the cross talk between adjacent metal lines and lowering the power dissipation.

Traditionally, the material of choice for the ILD is silicon dioxide ($SiO_2$) which can be prepared using silane, disilane or siloxane precursors in an oxidizing environment. The most popular deposition techniques for depositing ILD are chemical vapor deposition (CVD), low temperature plasma-enhanced CVD (PECVD), or high density plasma CVD (HDPCVD). However, the dielectric constant of the deposited $SiO_2$ is relatively high at 4.0.

As the semiconductor industry moves to smaller width metal lines, low-k materials must have smaller dielectric constants. Industry publications have indicated that low-k materials with k values from 2.7 to 3.5 would be needed for 150 and 130 nm technology modes. When the industry moves to 100 nm technology and dimensions below that in the future, extra low-k (ELK) materials having a k value from 2.2 to 2.6 and ultra low-k (ULK) materials with a k value less than 2.2 will be necessary.

The semiconductor industry has developed several low-k materials to replace silicon dioxide that are inorganic, organic or hybrid materials. These materials can be deposited by either chemical vapor deposition (CVD) or spin-on deposition (SOD) methods. The CVD technique utilizes existing vacuum tools for depositing $SiO_2$ that include lower temperature plasma enhanced CVD (PECVD) and high density plasma CVD (HDP-CVD). The SOD method uses spin coaters that have shown better extendibility to ELK or ULK by introducing pores in nanometer sizes. Newer materials such as fluorosilicate glass (FSG), carbon or carbon fluorine based films and carbon-doped $SiO_2$ utilize CVD techniques. Materials such as polyimide, hydrogen silsesquioxane (HSQ) and polyarylene ethers can be deposited using SOD techniques.

As such, a number of technologies to provide lower dielectric constant CVD materials have been demonstrated in the 3.5 to 2.6 range. However, there are far fewer alternatives for k values at or below 2.6 for CVD materials in ELK/ULK applications. The present invention provides for new materials for use as extra low dielectric CVD precursors in extra low-k CVD materials for the semiconductor industry.

Given the desires of the semiconductor industry for lower k value materials, new low-k CVD materials are being sought. The present invention provides a novel class of compounds useful for forming a film on a semiconductor or integrated circuit by acting as a precursor for the film formed when the compound is applied.

SUMMARY OF THE INVENTION

Polyhedral oligomeric silsesquioxane (POSS), having a variety of functional groups attached to a silicon oxide cage structure of the molecule, are employed in either a thermal chemical vapor deposition chamber or a plasma enhanced chemical vapor deposition chamber to form an ultra low-k dielectric film on the surface of semiconductors and integrated circuits. The POSS molecule, when combined with a linking agent in the CVD chambers, will react and polymerize to form the low-k dielectric film. The POSS molecule in general has the formula $Si_nO_{1.5n}\,(R^1)_i(R^2)_j(R^3)_k$, n=i+j+k and can range from about 3 to about 20 wherein $R^1$, $R^2$, and $R^3$ are organic or silicon functional groups or a combination of both groups.

DETAILED DESCRIPTION OF THE INVENTION

The present invention relates to a method of forming a low-k dielectric film on the surface of a semiconductor or an integrated circuit comprising reacting in a chemical vapor deposition chamber a polyhedral oligomeric silsesquioxane (POSS) with a polymeric linking agent thereby depositing on the semiconductor or integrated circuit surface and forming an ultra low-k dielectric where K is less than or equal to 2.6. The POSS molecule has the general formula of $Si_nO_{1.5n}\,(R^1)_i(R^2)_j(R^3)_k$, n=i+j+k and can range from about 3 to about 20 wherein $R^1$, $R^2$, and $R^3$ are organic or silicon functional groups or a combination of both groups. More particularly, $R^1$, $R^2$, and $R^3$ are selected from the group consisting of vinyl, oxymethyl, oxyethyl, phenyl, cyclopentyl, cyclohexyl, isobutyl, norborenal, norborenoethyl, norbornenyl, chlorosilane, silanol, alcohol, acrylates, particularly methacrylate, esters and expoxides.

Another functional group that may be employed in the methods of the present invention are siloxanes having the general formula ($—OSiH_x(CH_3)_{3-x}$) where x is 1 to 3. The siloxane may be a straight chain siloxane having the formula ($—O_{(x-1)}Si_xH_2((H_3)x)$ wherein x is 1 to 6 or a cyclic siloxane having the formula ($—O_xSi_xH_i(CH_3)_j$) where x is 3 to 8 and i−j=2x.

(I)

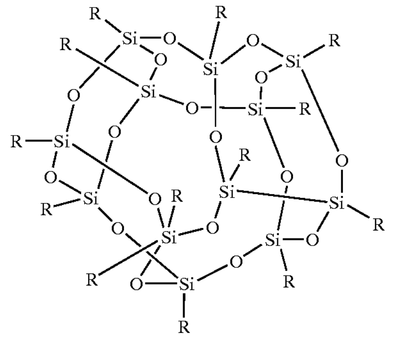

(II)

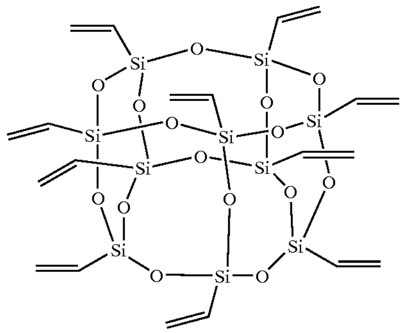

(III)

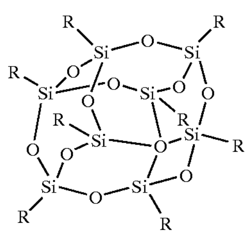

The above molecular structures are representative of the POSS molecule. (I) Contains 12 silicon atoms, (II) contains 10 silicon atoms and (III) contains 8 silicon atoms.

The linking agents are employed to react with the POSS molecule thereby polymerizing forming a polymerized molecular POSS structure into a continuous film formed on the semiconductor or integrated circuit surface. This reaction will occur via radical polymerization. The linking agents may be selected from the group consisting of, but not limited to, methylsilane, dimethylsilane, silane, disilane, vinylmethyldimethylcyclotrisiloxane, dimethylsilaoxocyclopentane, cyclohexylsilane, cyclohexyldisilane, silacyclobutane, tetramethyldisiloxane, cyclooctylsilane, vinylmethylsilane, cyclopentylsilane, (mono- or di-)tert-butyl silane, tert-butylphenylsilane, methyldisilane, tetraethyl-ethylsilicate, tetramethylethylsilicate, dimethyldioxymethylsilane, silylbenzene, disilylbenzene, trisilylbenzene, disilylcyclohexane and disiloxanes having the chemical formula $R_n(R')_{6-n}OSi_2$ where n is 1 to 6. The R and R' groups in the disiloxane may be selected from the group consisting of hydrogen, methyl, ethyl, tert-butyl, vinyl, ethoxy, methoxy, phenyl and halogens. Other linking agents may also include straight chain siloxanes such as $Si_nO_{(n-1)}(CH3)_{2n}H_2$ where n is 3 to 8. The present inventors have also found that organic peroxides such as benzoyl peroxide, acetyl-benzoyl peroxide, diacetyl peroxide, ditert-butyl peroxide, dimethyl peroxide and peroxides having $C_1$ to $C_5$ are effective as linking agents in the present invention.

The compounds containing the silyl groups are particularly suitable for formation of radicals to link one POSS functional group to another POSS functional group by stabilizing radical formation. Cyclotrisiloxane and cyclooctasilane contain large ring structures which can further increase the space between the POSS group as they link to one another during the polymerization. These large linking agents in the radical polymerization CVD can further reduce the dielectric constant using the POSS molecules and the linking agents. Silicon compounds with tert-butyl groups will also help stabilize the silyl radicals and the t-butyl groups may act as "leaving groups" that will increase porosity of the film during subsequent anneals at 250–400° C. in a hydrogen environment.

Partial oxidation to remove hydrogen atoms can be employed by forming silyl radicals by the following example.

$$2R—SiH_3+O_2\rightarrow 2R—SiH_2+2H_2O$$

When there is a deficit of oxygen, silane has been known to form silyl radicals which stay in a metastable state (which can be stabilized by appropriate choice of functional groups such as t-butyl or cyclo-organics). This metastable state is maintained until the silyl radical combines with another functional group sometimes in an explosive manner. This tendency to form silyl radicals can be exploited by putting a small quantity of oxygen, ozone or peroxide compound in contact with the silyl groups on several of the linking agents described above and forming the silyl radicals. Methyl radicals may also be formed in a similar manner, but they are even less stable. The less stable methyl radicals may also participate in this reaction. The silicon oxide cages of the POSS molecule may also be open such that the functional materials from the polymeric linking agent attach to the open side of the silicon oxide cage.

Another method for forming the low-k dielectric film that may be employed in the present invention is with the use of plasma. Plasmas are known to create radicals by electronic bombardment in a plasma field. Methylsilane radicals can be formed by creating plasma with or without the presence of a small quantity of oxygen that activates the methylsilane. These radicals can then subsequently react with the functional groups on the vaporized POSS material.

The other linking agents may be treated in a manner similar to that of the methylsilane to create radicals that are then employed to polymerize with the gas phase POSS delivered into the CVD chamber. Typically, the POSS compound is a solid, generally a white crystalline powder. However, in some instances, materials having the POSS formula, depending upon the particular symmetry and molecular weight, are volatile under typical CVD conditions.

The POSS material will be dissolved in an appropriate solvent moderate volatility such as of cyclohexane, benzene, normal and cyclo-siloxanes, volatile silicone solvents, tetrahydrofuran and certain of the linking agents suggested earlier, particularly the volatile silanes, siloxanes and organosiloxanes. However, if the solvent interferes with the plasma formation, the POSS material can be delivered as a sublimed solid in a pure form to the CVD chamber. The solution is injected into a region of the reactor where the pressure is between 0.1 and 10 torr and the solution is heated above the vaporization point as measured at 1 torr for the selected POSS material. Typically, this is around 100 to 450° C. A stream of the vaporized gas at vacuum would be injected into a stream containing the activated linking agents.

Under these conditions, the radicals are generated by partial reaction with oxygen in the thermal reactor chamber or by passing through a plasma region which will create linking agent radicals that will also combine with the POSS and solvent materials. This combined flow will then pass over the heated wafer which is heated from 200 to 450° C. depending upon the appropriate combined POSS material and linking agent's properties. The semiconductor substrate or integrated circuit is typically a silicon wafer and can be up to 300 mm in diameter.

Some advantages of using POSS film include: (1) internal free space can be selected at the precursor level. Comparison can be made to the density with $SiO_2$ film to see the reduction; (2) free space between POSS cages can be engineered using different types of linkage precursor; and (3) thermal-mechanical strength, hardness, modulus, thermal stability, surface roughness, etc. can be engineered by selection of the appropriate linkage precursor and deposition conditions.

EXAMPLES

Two milliliters per minute of cyclohexane which contains 10% by mass of POSS #1 material, a chemical mixture of polyhedral oligometric silsesquioxane compounds containing 82% $C_{24}H_{36}Si_{12}O_{18}$, 16% $C_{20}H_{30}Si_{10}O_{15}$, and 2% $C_{16}H_{24}Si_8O_{12}$, is injected into a chamber operated at 3 torr. The solution was sprayed into the chamber using an ultrasonic nebulizer designed to deliver the solution in 20 $\mu$L droplets allowing for the complete vaporization before coming in contact with the wafer, which is heated to 250° C. In separate manifolds, methylsilane (MMS) was flowing at 100 sccm and oxygen was flowing ate 20 sccm entering into the chamber via a manifold directly above the MMS manifold. Reaction occurred on the 4" wafer creating a 30 micron localized deposition. In comparing this to deposition on a wafer which is generated by the reaction of methylsilane, oxygen and cyclohexane in the absence of a POSS material, one fifth of the thickness of deposition occurred. This demonstrates the polymerization reaction takes place on the wafer due to the interaction of the methylsilane linking agent and the POSS material.

POSS may be delivered without a solvent by using a PECVD chamber with a sublimation chamber. Either AC or DC plasma is struck between the methylsilane, oxygen showerhead and the hotplate. The vinyl POSS material is heated in an outboard chamber that is about 0.1 to 5 torr chamber pressure. The POSS chamber is heated above the 200–300° C. temperatures necessary to volatize the POSS at the pressures of the chamber. The POSS vapor is carried to the chamber using an inert gas flow, typically argon, the hotplate holding the wafer is heated to 200–300° C. The monomethylsilane radicals from the plasma react with the POSS functional groups and form the low-k dielectric material on the wafer.

In another example, POSS ($C_{16}H_{56}O_{20}Si_{16}$) with 8 siloxane groups with 2 methyl and one hydrogen group on each silicon in each functional group is dissolved (4% by weight) in cyclohexane. Four ml/min of liquid is injected into the thermal CVD chamber. The solution is heated in the chamber to 250° C. in a heated metal mesh at 1–5 torr chamber pressure. The vaporized gases then passes through two ring manifolds. The first manifold supplies 100 sccm of hexamethyl dihydro trisiloxane (vapor from a vessel of the liquid heated to 128° C.) and the second supplies 40 sccm of oxygen. The siloxane functional groups on the POSS and trisiloxane react with $O_2$ in a partial oxidation reaction that reacts with some of the hydrogen atoms on the compounds forming radicals. These radicals polymerize on the 250° C. substrate wafer to form a low-k deposit. The monomethylsilane and trisiloxane compounds bridge between the siloxane functional groups on the POSS forming additional cage structure.

While this invention has been described with respect to particular embodiments thereof, it is apparent that numerous other forms and modifications of the invention will be obvious to those skilled in the art. The appended claims and this invention generally should be construed to cover all such obvious forms and modifications which are within the true spirit and scope of the present invention.

Having thus described the invention, what we claim is:

1. A method of depositing a low-k dielectric film on a semiconductor or integrated circuit surface comprising reacting a polyhedral oligomeric silsesquioxane and a linking agent in a chemical vapor deposition process thereby forming said low-k dielectric material.

2. The method as claimed in claim 1 wherein said polyhedral oligomeric silsesquioxane compound has the formula $Si_nO_{1.5n}\ (R^1)_i(R^2)_j(R^3)_k$, wherein n=i+j+k and can range from about 3 to about 20 wherein $R^1$, $R^2$, and $R^3$ are organic or silicon functional groups or a combination of both groups.

3. The method as claimed in claim 2 wherein n is 6, 8, 10 or 12.

4. The method as claimed in claim 2 wherein said $R^1$, $R^2$, and $R^3$ are selected from the group consisting of vinyl, oxymethyl, oxyethyl, pentyl, cyclopentyl, cyclohexyl, isobutyl, norborenal, norborenoethyl, norbornenyl, chlorosilane, silanol, alcohol, methacrylate, esters, hydromethylsiloxyl and epoxide functional groups.

5. The method as claimed in claim 2 wherein said linking agent is a straight chain or cyclic siloxane.

6. The method as claimed in claim 5 wherein said straight chain siloxane has the formula $(\text{—}O_{(X-1)}Si_XH_2(CH_3)_X)$ wherein x is 1 to 6 and said cyclic siloxane has the formula $(\text{—}O_XSi_XH_i(CH_3)_j)$ where X is 3 to 8 and i−j=2X.

7. The method as claimed in claim 1 wherein said linking agent is selected from the group consisting of methylsilane, dimethylsilane, silane, disilane, vinylmethyldimethylcyclotrisiloxane, dimethylsilaoxocyclopentane, cyclohexylsilane, cyclohexyldisilane, silacyclobutane, tetramethyldisiloxane, cyclooctylsilane, vinylmethylsilane, cyclopentylsilane, tert-butylphenyisilane, methyldisilane, tetraethyl-ethylsilicate, tetramethylethylsilicate, dimethyldioxymethylsilane, silylbenzene, disilylbenzene, trisilylbenzene, disilylcyclohexane and disiloxanes having the formula $R_n(R')_{6-n}OSi_2$ wherein R and R' are selected from the groups consisting of hydrogen, methyl, ethyl, tert-butyl, vinyl, ethoxy, methoxy, phenyl and halogen and n is 1 to 6.

8. The method as claimed in claim 1 wherein said linking agent is an organic peroxides selected from the group consisting of benzoyl peroxide, acetyl-benzoyl peroxide, diacetyl peroxide, ditert-butyl peroxide, dimethyl peroxide and peroxides having $C_1$ to $C_5$.

9. The method as claimed in claim 1 wherein said polyhedral oligomeric silsesquioxane is dissolved in a solvent prior to addition to said chemical vapor deposition system.

10. The method as claimed in claim 9 wherein said solvent is selected from the group consisting of cyclohexane, benzene, normal and cyclo-siloxanes, volatile silicone solvents, straight chain and cylo-siloxanes with methyl and hydro functional groups and tetrahydofuran.

11. The method as claimed in claim 1 wherein said polyhedral oligomeric silsesquioxane is sublimed in the vacuum chamber by a direct sublimation heater in the chemical vapor deposition system.

12. A method of depositing a low-k dielectric film on a semiconductor or integrated circuit surface comprising reacting a polyhedral oligomeric silsesquioxane and a linking agent in the presence of a plasma in a chemical vapor deposition process thereby forming said low-k dielectric material.

13. The method as claimed in claim 12 wherein said polyhedral oligomeric silsesquioxane compound has the formula $Si_n$, $O_{1.5n}$ $(R^1)$, $(R^2)$, $(R^3)$, wherein n=i+j+k and can range from about 3 to about 20 wherein $R^1$, $R^2$, and $R^3$ are organic or silicon functional groups or a combination of both groups.

14. The method as claimed in claim 13 wherein n is 6, 8, 10 or 12.

15. The method as claimed in claim 13 wherein said $R^1$, $R^2$, and $R^3$ are selected from the group consisting of vinyl, oxymethyl, oxyethyl, pentyl, cyclopentyl, cyclohexyl, isobutyl, norborenal, norborenoethyl, norbornenyl, chlorosilane, silanol, alcohol, methacrylate, hydromethylsiloxyl, esters and epoxide functional groups.

16. The method as claimed in claim 13 wherein said linking agent is a straight chain or cyclic siloxane.

17. The method as claimed in claim 13 wherein said straight chain siloxane has the formula $(—O_{(X-1)}Si_XH_2(CH_3)_x)$ wherein x 1 to 6 and said cyclic siloxane has the formula $(—O_XSi_XH_i(CH_3)_j)$ where X is 3 to 8 and i–j=2X.

18. The method as claimed in claim 12 wherein said linking agent is selected from the group consisting of methylsilane, dimethylsilane, silane, disilane, vinyl methyldimethyl cyclotrisiloxane dimethylsila-oxocyclopentane, cyclohexylsilane, cyclohexyldisilane, silacyclobutane, tetramethyldisiloxane, cyclooctylsilane, vinylmethylsilane, cyclopentylsilane, tert-butylphenylsilane, methyldisilane, tetraethyl-ethyl silicate, tetra methyl ethyl silicate, dimethyldioxymethylsilane, silylbenzene, disilylbenzene, trisilylbenzene, disilylcyclohexane and disiloxanes having the formula $R_n(R')_{6-n}OSi_2$ wherein R and R' are selected from the groups consisting of hydrogen, methyl, ethyl, tert-butyl, vinyl, ethoxy, methoxy, phenyl and halogen and n is 1 to 6.

19. The method as claimed in claim 12 wherein said linking agent is an organic peroxides selected from the group consisting of benzoyl peroxide, acetyl-benzoyl peroxide, diacetyl peroxide, ditert-butyl peroxide, dimethyl peroxide and peroxides having $C_1$ to $C_5$.

20. The method as claimed in claim 12 wherein said polyhedral oligomeric silsesquioxane is dissolved in a solvent prior to addition to said chemical vapor deposition system.

21. A method of depositing a low-k dielectric film on a semiconductor or integrated circuit surface comprising reacting a polyhedral oligomeric silsesquioxane having the formula $Si_nO_{1.5n}$ $(R^1)_i(R^2)_j(R^3)_k$, wherein n=i+j+k and can range from about 3 to about 20 wherein $R^1$, $R^2$, and $R^3$ are organic or silicon functional groups or a combination of both groups and a linking agent in a chemical vapor deposition process thereby forming said low-k dielectric material.

22. The method as claimed in claim 21 wherein $R^1$ is 6, 8, 10 or 12.

23. The method as claimed in claim 22 wherein said $R^1$, $R^2$, and $R^3$ are selected from the group consisting of vinyl, oxymethyl, oxyethyl, pentyl, cyclopentyl, cyclohexyl, isobutyl, norborenal, norborenoethyl, norbornenyl, chlorosilane, silanol, alcohol, methacrylate, hydromethylsiloxyl, esters and epoxide functional groups.

24. The method as claimed in claim 22 wherein said linking agent is a straight chain or cyclic siloxane.

25. The method as claimed in claim 24 wherein said straight chain siloxane has the formula $(—O_{(X-1)}Si_xH_2(CH_3)_x)$ wherein x is 1 to 6 and said cyclic siloxane has the formula $(—O_XSi_XH_i(CH_3)_j)$ where X is 3 to 8 and i–j=2X.

26. The method as claimed in claim 21 wherein said linking agent is selected from the group consisting of methylsilane, dimethylsilane, silane, disilane, vinyl methyldimethylcyclotrisiloxane, dimethylsila-oxocyclopentane, cyclohexylsilane, cyclohexyldisilane, silacyclobutane, tetramethyldisiloxane, cyclooctylsilane, vinylmethylsilane, cyclopentylsilane, tert-butylphenylsilane, methyldisilane, tetraethyl-ethylsilicate, tetra meth ylethyl silicate, dimethyldioxymethylsilane, silylbenzene, disilylbenzene, trisilylbenzene, disilylcyclohexane and disiloxanes having the formula $R_n(R')_{6-n}OSi_2$ wherein R and R' are selected from the groups consisting of hydrogen, methyl, ethyl, tert-butyl, vinyl, ethoxy, methoxy, phenyl and halogen and n is 1 to 6.

27. The method as claimed in claim 21 wherein said linking agent is an organic peroxides selected from the group consisting of benzoyl peroxide, acetyl-benzoyl peroxide, diacetyl peroxide, ditert-butyl peroxide, dimethyl peroxide and peroxides having $C_1$ to $C_5$.

28. The method as claimed in claim 21 wherein said polyhedral oligomeric silsesquioxane is dissolved in a solvent prior to addition to said chemical vapor deposition system.

29. The method as claimed in claim 28 wherein said solvent is selected from the group consisting of cyclohexane, benzene, normal and cyclosiloxanes, volatile silicone solvents and tetrahydofuran.

30. The method as claimed in claim 1 wherein said polyhedral oligomeric silsesquioxane is sublimed in the vacuum by a direct sublimation heater in the chemical vapor deposition system.

* * * * *